(12) United States Patent
Kung et al.

(10) Patent No.: US 12,093,341 B2
(45) Date of Patent: Sep. 17, 2024

(54) METHOD AND APPARATUS FOR PROCESSING MATRIX DATA THROUGH RELAXED PRUNING

(71) Applicant: SAMSUNG ELECTRONICS CO., LTD., Suwon-si (KR)

(72) Inventors: Jaeha Kung, Daegu (KR); Jae-Joon Kim, Pohang-si (KR); Junki Park, Pohang-si (KR)

(73) Assignees: SAMSUNG ELECTRONICS CO., LTD. (KR); DAEGU GYEONGBUK INSTITUTE OF SCIENCE AND TECHNOLOGY (KR); POSTECH RESEARCH AND BUSINESS DEVELOPMENT FOUNDATION (KR)

( * ) Notice: Subject to any disclaimer, the term of this patent is extended or adjusted under 35 U.S.C. 154(b) by 345 days.

(21) Appl. No.: 17/137,803

(22) Filed: Dec. 30, 2020

(65) Prior Publication Data

US 2021/0209190 A1    Jul. 8, 2021

(30) Foreign Application Priority Data

Dec. 31, 2019  (KR) .......................... 10-2019-0180035

(51) Int. Cl.
*G06F 17/16* (2006.01)
*G06F 1/03* (2006.01)
(Continued)

(52) U.S. Cl.
CPC ................ *G06F 17/16* (2013.01); *G06F 1/03* (2013.01); *G06F 7/02* (2013.01); *G06F 7/523* (2013.01); *H03M 7/42* (2013.01)

(58) Field of Classification Search
CPC ............ G06F 17/16; G06F 1/03; G06F 7/523; H03M 7/42; H03M 7/40–4093; H03M 7/425–50
See application file for complete search history.

(56) References Cited

U.S. PATENT DOCUMENTS 8,700,552 B2    4/2014  Yu et al.
9,818,059 B1 *  11/2017  Woo ........................ G06F 15/76
(Continued)

FOREIGN PATENT DOCUMENTS

KR    10-2018-0084289 A    7/2018
KR    10-2020-0027080 A    3/2020

OTHER PUBLICATIONS

Kung et al., "Peregrine: A Flexible Hardware Accelerator for LSTM with Limited Synaptic Connection Patterns", Proceedings of the 56th Annual Design Automation Conference 2019, Jun. 2-6, 2019, Article No. 209, Stanford, California, USA (Year: 2019).*

(Continued)

*Primary Examiner* — Emily E Larocque
(74) *Attorney, Agent, or Firm* — Fish & Richardson P.C.

(57) ABSTRACT

A matrix data processing method performed by a computing device which performs a matrix multiplication operation includes, with respect to each of one or more elements included in a matrix, when a value of each element satisfies a designated condition, determining the element to be a don't-care element and determining an output value of the don't-care element, generating a bitstream based on the output value of the don't-care element and index values of valid elements included in the matrix, and equally dividing the bitstream into pieces of a designated number, and generating a Huffman code corresponding to each of a plurality of lower bitstreams that are generated as a result of the equal division.

8 Claims, 10 Drawing Sheets

(51) Int. Cl.
    *G06F 7/02*     (2006.01)
    *G06F 7/523*     (2006.01)
    *H03M 7/42*     (2006.01)

(56) References Cited

U.S. PATENT DOCUMENTS

| | | |
|---|---|---|
| 10,565,207 B2 | 2/2020 | Huang |
| 2018/0082181 A1 | 3/2018 | Brothers et al. |
| 2018/0204110 A1 | 7/2018 | Kim et al. |
| 2018/0336468 A1 | 11/2018 | Kadav et al. |
| 2019/0266479 A1* | 8/2019 | Singh .................... G06N 3/048 |
| 2020/0143250 A1 | 5/2020 | Lee |

OTHER PUBLICATIONS

Kung et al., "Relaxed Pruning: Memory-Efficient LSTM Inference Engine by Limiting the Synaptic Connection Patterns", SysML '18, Feb. 2018, Stanford, California, USA (Year: 2018).*

Cong et al., "Combinational Logic Synthesis for LUT Based Field Programmable Gate Arrays", ACM Transactions on Design Automation of Electronics Systems, Apr. 1996, Los Angeles, California, USA (Year: 1996).*

Han et al., Deep Compression: Compressing Deep Neural Networks with Pruning, Trained Quantization and Huffman Coding, ICLR 2016, Feb. 2016, Stanford, California, USA. (Year: 2016).*

Leeuwen, On the Construction of Huffman Trees, 3rd ICALP '76, 1976. (Year: 1976).*

Also D.A. Patterson et al., Computer Organization and Design: The Hardware/Software interface, Elsevier Science and Technology, 2007 (Year: 2007).*

See digital Logic Handbook, Modules Hardware Applications, Positive Logic Edition, Digital Equipment Corporation, 1969 (Year: 1969).*

Kung et al.—"A Flexible Hardware Accelerator for LSTM with Limited Synaptic Connection Patterns", 2019 56th ACM/IEEE Design Automation Conference (DAC).

* cited by examiner

METHOD AND APPARATUS FOR PROCESSING MATRIX DATA THROUGH RELAXED PRUNING

CROSS-REFERENCE TO RELATED APPLICATION

Korean Patent Application No. 10-2019-0180035, filed on Dec. 31, 2019, in the Korean Intellectual Property Office, and entitled: "Method and Apparatus for Processing Matrix Data Through Relaxed Pruning," is incorporated by reference herein in its entirety.

BACKGROUND

1. Field

Embodiments relate to a method and apparatus for processing matrix data through relaxed pruning, and more particularly, to relaxed pruning.

2. Description of the Related Art

As artificial intelligence has been developing, various types of neural network models are being developed. In most neural network models, matrix multiplication is performed, but transmission/reception of matrix data costs a lot. In particular, in a case of a matrix having sparsity, the cost is greater as compared with the elements of a matrix having significant values.

In acceleration hardware, a compressed sparse column (CSC) format may be used to effectively process the sparsity of a parameter matrix indicating connectivity between layers, but there is a limitation that a compression rate decreases as a size of the matrix increases.

SUMMARY

Embodiments are directed to a matrix data processing method to be performed by a computing device that performs a matrix multiplication operation, the matrix data processing method including: with respect to each of one or more elements included in a matrix, when a value of each element satisfies a designated condition, determining the element to be a don't-care element and determining an output value of the don't-care element; generating a bitstream based on the output value of the don't-care element and index values of valid elements included in the matrix; and equally dividing the bitstream into pieces of a designated number, and generating a Huffman code corresponding to each of a plurality of lower bitstreams that are generated as a result of the equal division.

Each of the valid elements may be a non-zero element, and the determining of the output value of the don't-care element may include, when the value of the element is greater than a first threshold value and less than a second threshold value, changing the element into the don't-care element and determining the output value of the don't-care element as a value of an invalid element or the don't-care element.

The bitstream may include bits, the number of which is equal to a number of elements in the matrix, and the generating of the bitstream may include generating a bitstream including 1 bits corresponding to indices of the valid elements and 0 bits corresponding to indices of invalid elements.

Embodiments are also directed to a matrix data processing apparatus including a processor, wherein the processor is configured to, with respect to each of one or more elements included in a matrix, determine each element to be a don't-care element when a value of the element satisfies a designated condition, determine an output value of the don't-care element as an element value of an invalid element or the don't-care element, generate a bitstream based on the output value of the don't-care element and index values of valid elements included in the matrix, equally divide the bitstream into a designated number of pieces, and generate a Huffman code corresponding to each of a plurality of lower bitstreams that are obtained as a result of the equal division.

The processor may be further configured to generate a Huffman tree corresponding to the Huffman code, and further includes look-up tables respectively corresponding to levels in the Huffman tree, and a number of look-up tables corresponding to an n-th level of the Huffman tree may be greater than a number of look-up tables corresponding to an n+1st level of the Huffman tree.

Each of the valid elements may be a non-zero element, and the processor may be further configured to, when the value of the element is greater than a first threshold value and less than a second threshold value, change the element into the don't-care element.

The bitstream may include bits, the number of which is equal to a number of elements in the matrix, and the processor may be further configured to generate a bitstream including 1 bits corresponding to indices of the valid elements and 0 bits corresponding to indices of the invalid elements.

Embodiments are also directed to a non-transitory computer-readable recording medium including instructions which, when executed, cause a computer to execute the method according to an embodiment.

BRIEF DESCRIPTION OF THE DRAWINGS

Features will become apparent to those of skill in the art by describing in detail example embodiments with reference to the attached drawings in which.

DETAILED DESCRIPTION

Figure 1:
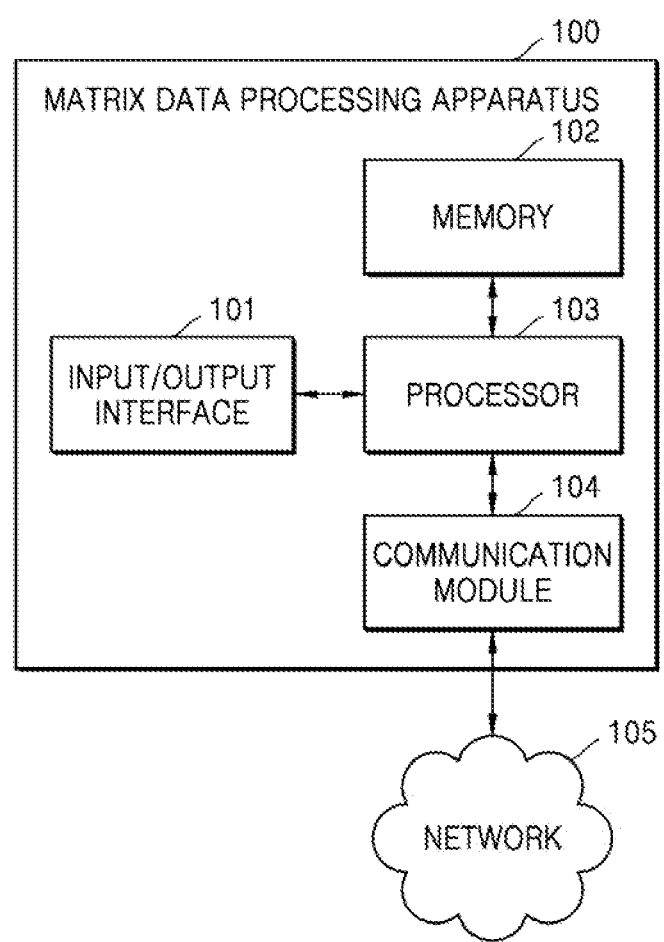
FIG. 1 is a diagram for describing a structure and an operation of a matrix data processing apparatus executing a matrix data processing method according to an example embodiment.

FIG. 1 is a diagram for describing a structure and an operation of a matrix data processing apparatus executing a matrix data processing method according to an example embodiment.

A matrix data processing apparatus 100 according to the present example embodiment may include an input/output interface 101, a memory 102, a processor 103, a communication module 104, which may communicate via a system bus, and a network 105 communicatively coupled to the communication module 104, as illustrated in FIG. 1.

The input/output interface 101 may be a unit for interfacing with an input/output device. For example, an input device may include a device such as a keyboard, a mouse, etc., and an output device may include a device such as a display for displaying a communicating session with an application. In another example, the input/output interface 101 may be a unit for interfacing with a device, in which input and output functions are integrated, such as a touch screen. In more detail, when the processor 103 of the matrix data processing apparatus 100 processes a command of a computer program loaded from the memory 102, a service screen or visualized data configured by using data provided from an external server may be displayed on the display through the input/output interface 101.

In the present example embodiment, the memory 102 is a computer-readable recording medium, and may include a random access memory (RAM), a read only memory (ROM), and a permanent mass storage device such as a disk drive. Also, the memory 102 may store an operating system and at least one program code. The above software elements may be loaded from a computer-readable recording medium separate from the memory 102, by using a drive mechanism. Such a separate computer-readable recording medium may include a floppy drive, a disc, tape, a DVD/CD-ROM drive, a memory card, etc. In another example embodiment, software elements may be loaded to the memory 102 through the communication module 104 instead of the computer-readable recording medium. For example, at least one program may be loaded to the memory 102 based on a program installed by files provided over a network from developers or a file distribution system that provides an installation file of the application.

The processor 103 may be configured to process commands of a computer program by performing basic arithmetic operations, logic operations, and I/O operations. The commands may be provided from the memory 102 or the communication module 104 to the processor 103. For example, the processor 103 may be configured to execute received commands in response to the program code stored in the recording device, such as the memory 102.

The present example embodiment may maximize utilization of sparsity in a Long Short-Term Memory (LSTM) model and a Huffman-coded Nonzero Indication Relaxed Pruning (HNI-RP) data format. Unlike a pruning method using one threshold value, i.e., hard threshold, a relaxed pruning may be used that sets a threshold range. For example, when the pruning is performed, two or more threshold values may be used, and thus, accuracy in data classification, categorization, or labelling may be improved. With respect to each of one or more elements included in a matrix, when a value of each element satisfies a given condition, the processor 103 may determine the element as a don't-care element. The don't-care element may denote an element, an output value of which is not determined.

The processor 103 may further determine an output value of the don't-care element as an invalid element or an element value, generate a bitstream based on the output value of the don't-care element and index values of valid elements included in the matrix, except for the invalid element, equally divide the bitstream into a specified number of pieces, and generate a Huffman code corresponding to each of a plurality of lower bitstreams that are generated as a result of the equal division.

The communication module 104 may provide a function for an external server and the matrix data processing apparatus 100 to communicate with each other through a network. The communication module 104 may provide a function for communicating with another user and another server. For example, a request generated by the processor 103 of the matrix data processing apparatus 100 according to program code stored in a storage device such as the memory 102 may be transferred to an external server via the network according to control of the communication module 104. On the other hand, a control signal, a command, content, a file, etc. provided according to control of a processor in an external server may be received by the matrix data processing apparatus 100 via the communication module 104 of the matrix data processing apparatus 100 after passing through a communication module and a network. For example, a control signal, command, etc. of an external server received through the communication module 104 may be transferred to the processor 103 or the memory 102, and content, a file, etc. may be stored in a storage device, which may be included in the matrix data processing apparatus 100.

The communication method may include, e.g., a communication using a communication network (e.g., a mobile communication network, wired Internet, wireless Internet, broadcast network, etc.) that may be included in the network, and near distance wireless communication between devices. For example, the network may include one or more networks, e.g., a personal area network (PAN), local area network (LAN), campus area network (CAN), metropolitan area network (MAN), wide area network (WAN), broadband network (BBN), the Internet, etc. In addition, the network may include, e.g., one or more arbitrary networks from network topology including a bus network, a star network, a ring network, a mesh network, a star-bus network, a tree, or hierarchical network, etc.

In an example embodiment, the matrix data processing apparatus 100 may include elements other than those of FIG. 1. For example, the matrix data processing apparatus 100 may further include other elements such as a transceiver, a global positioning system (GPS) module, a camera, various sensors, a database, etc.

Figure 2:
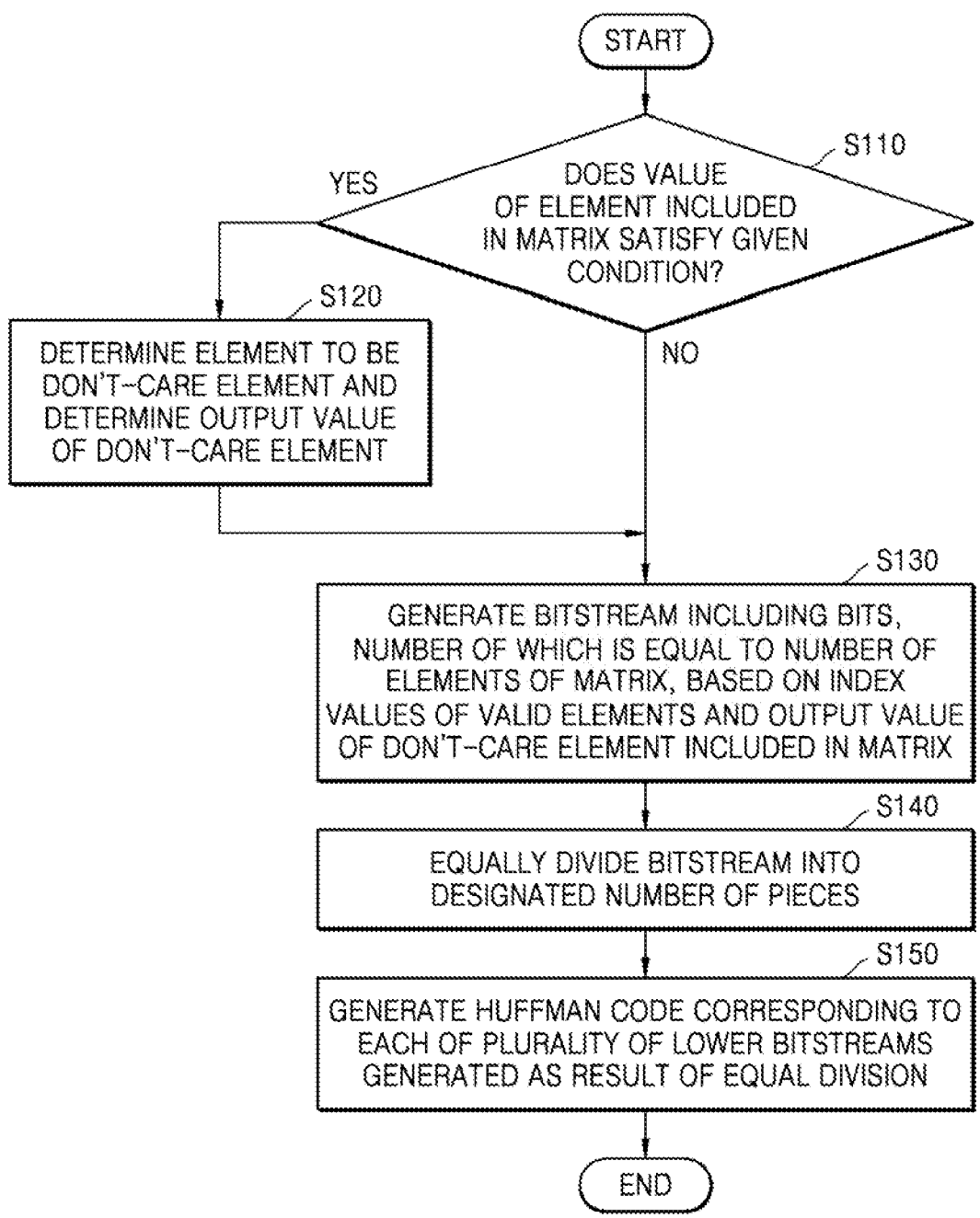
FIG. 2 is a flowchart of a method of processing matrix data according to an example embodiment.

FIG. 2 is a flowchart of a method of processing matrix data according to an example embodiment.

In operation S110, the matrix data processing apparatus may identify whether a value of an element included in a matrix satisfies a given condition. For example, the matrix data processing apparatus may perform a matrix operation in various artificial neural networks. In an example, the given condition may include a reference value for performing a pruning (described in detail below). The pruning may be used to reduce the number of branches to be searched for, when a searching operation for solving problems in artificial intelligence is expressed as graph searching. The matrix data processing apparatus according to an example embodiment may perform a pruning whereby elements satisfying the given condition are changed to don't-care elements. The given condition may be set by, for example, a user or by an external server.

In operation S120, when a certain element satisfies the given condition, the matrix data processing apparatus may determine the corresponding element as a don't-care element, and may determine an output value of the don't-care element. The don't-care element may denote an element, an output value of which is not determined.

The output value of the don't-care element may be determined such that a size of a group having the same value in a matrix is increased. The output value of the don't-care element may be determined as a value of an invalid element or the don't-care element. When the output value of the don't-care element is determined as an element value, the don't-care element may be dealt with like a valid element in post-processes. From among the don't-care elements, the element of the matrix, which is determined as the invalid element, is not separately stored, and may not be used in a data operation process or a data transmission process after that. For example, when a value of a target element is greater than a first threshold value and less than a second threshold value, the matrix data processing apparatus may determine the corresponding element as a don't-care element.

In operation S130, when a certain element does not satisfy the given condition, the matrix data processing apparatus may determine the corresponding element as a valid element or an invalid element. For example, when the given condition is to be included between the first threshold value and the second threshold value, an element equal to or less than the first threshold value may be determined as an invalid element, and an element exceeding the second threshold value may be determined as a valid element. After that, the matrix data processing apparatus may generate a bitstream including bits, the number of which is equal to that of the elements in the matrix, based on an index value of the valid element. The valid element may be, e.g., a non-zero element of the matrix, and the invalid element may be, e.g., a zero element of the matrix. In this case, the matrix data processing apparatus may separately store data about the valid element, and after that, the data about the valid element may be used in the data operation process or the data transmission process. The data about the valid element may include a value of the valid element and row or column information of the valid information.

The index value of the valid element may be data related to a location of the valid element in the matrix. For example, an index value of an element in a matrix may be assigned according to a row priority order, and may be assigned according to a column priority order. Therefore, a bitstream generated according to an example embodiment may include bits respectively corresponding to elements in the matrix. In this case, the number of bits corresponding to each of the elements in the matrix may be one, but one or more bits may correspond to each of the elements in the matrix. Additional details are provided below with reference to related drawings.

In an example embodiment, when an element in the matrix is a valid element, a bit corresponding to the element may be '1', and when an element in the matrix is an invalid element, a bit corresponding to the element may be '0'. Therefore, in this case, the generated bitstream may consist of '1' bits corresponding to indices of valid elements and '0' bits corresponding to indices of invalid elements.

Therefore, the data about the valid elements of the matrix according to the present example embodiment may include the value of the valid element and a bitstream corresponding to the index value of the valid element.

In operation S140, the matrix data processing apparatus may equally partition the bitstream into a designated number of pieces. The designated number may be determined based on a data transmission capacity, a memory capacity, a data transmission speed, etc., or may be based on a type of the matrix. For example, in a case of a bitstream including 12 bits corresponding to a 3×4 matrix, the bitstream may be equally divided into pieces each including 3 bits.

In operation S150, the matrix data processing apparatus may generate a Huffman code corresponding to each of a plurality of lower bitstreams generated as a result of equal division. For example, when the bitstream including 12 bits is equally divided into four lower bitstreams, a Huffman code '0' corresponding to a first lower bitstream, a Huffman code '10' corresponding to a second lower bitstream, a Huffman code '110' corresponding to a third lower bitstream, and a Huffman code '111' corresponding to a fourth lower bitstream may be generated. In this case, the bitstream including 12 bits may be replaced with 9 bits, i.e., the Huffman codes. Additional details are provided below with reference to related drawings.

Figure 3:
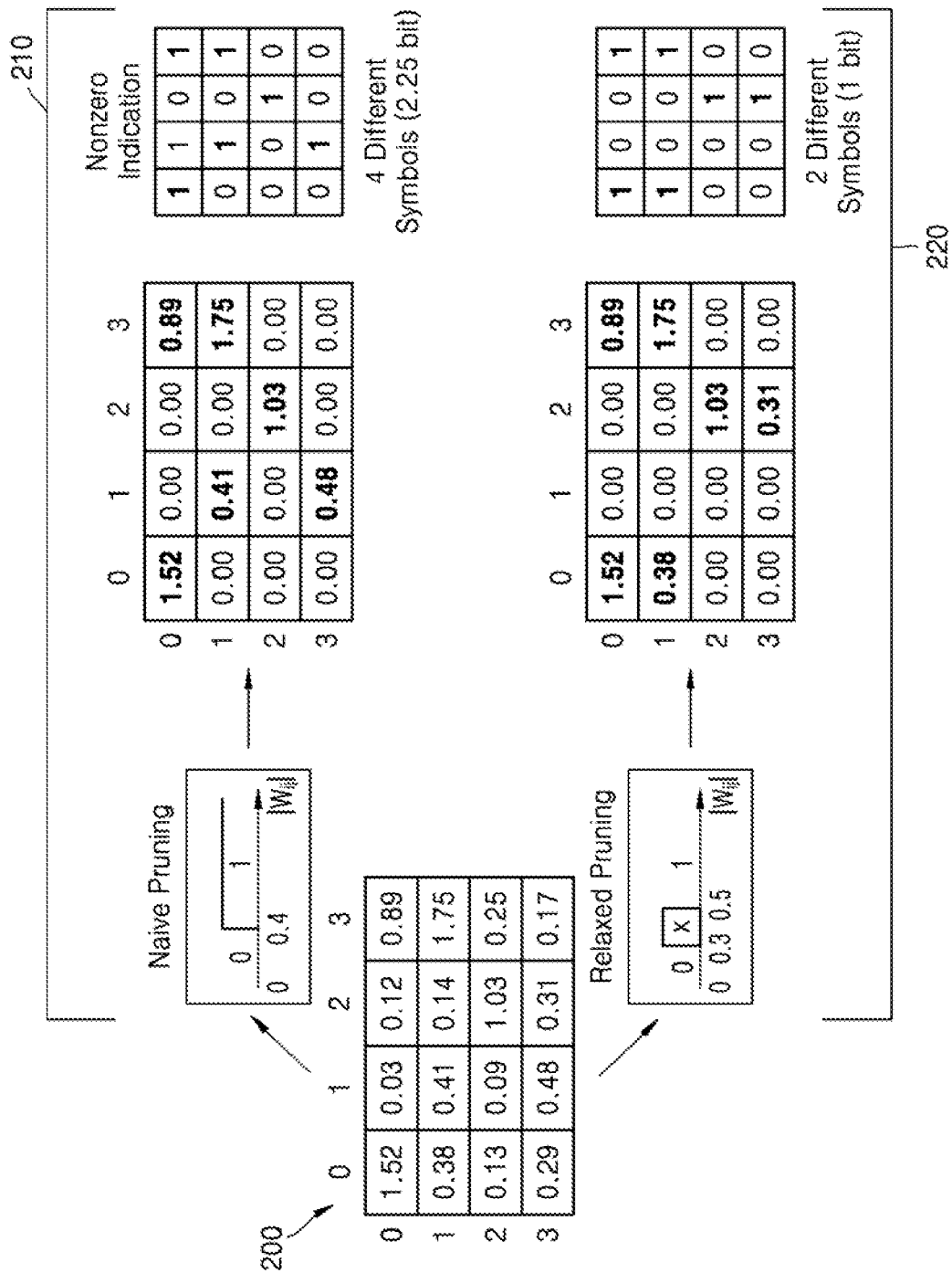
FIGS. 3 and 4 are diagrams for describing a method of performing pruning according to an example embodiment.
Figure 4:
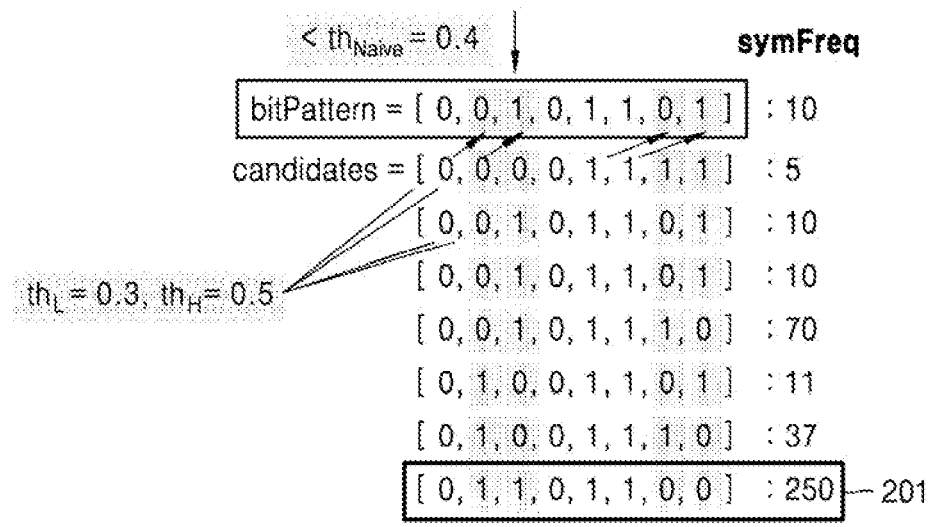

FIGS. 3 and 4 are diagrams for describing a method of performing pruning according to an example embodiment.

According to the present example embodiment, a matrix data processing apparatus performing a matrix operation of an artificial neural network may perform a pruning of matrix data in order to increase a processing speed and accuracy of the neural network. The matrix data processing apparatus according to an example embodiment may perform a pruning, in which a non-zero element satisfying the given condition is changed to a don't-care element and an output value of the don't-care element is determined. In contrast, when only one threshold value is designated and an element less than the threshold value is determined to be an invalid element and an element equal to or greater than the threshold value is determined to be a valid element, flexible processing of the data is relatively limited.

In further detail, the matrix data processing apparatus according to an example embodiment may perform the pruning of the matrix data by using two threshold values. In an example embodiment, only when a value of each element in a matrix is equal to or greater than a first threshold value and less than a second threshold value, the element of the matrix may be determined to be a don't-care element. As described above, when an element is determined to be a don't-care element only when a value of the element is within a certain section, a plurality of elements corresponding to opposite sides of that section may be clearly clustered. In particular, a matrix data processing apparatus performing a matrix multiplication operation of an artificial neural network may improve accuracy in data classification, categorization, or labelling by performing the pruning operation. In addition, output values of the don't-care elements are not determined according to a certain given condition, but may be determined with respect to other values in the matrix.

In an example embodiment, referring to FIG. 3, a case (210) in which the pruning is performed on an initial matrix 200 by using one threshold value and a case (220) in which the pruning is performed by using two or more threshold values according to an example embodiment will be described below. When the matrix is expressed in an arrangement according to a row priority order, the matrix may be expressed as follows [{1.52, 0.03, 0.12, 0.89}, {0.38, 0.41, 0.14, 1.75}, {0.13, 0.09, 1.03, 0.25}, {0.29, 0.48, 0.31, 0.17}].

First, the case 210 in which the pruning is performed by using one hard threshold value according to the related art will be described. For example, when a threshold value is set as 0.4 so that an element having a value less than 0.4 is determined to be an invalid element (e.g., a zero element) and an element having a value equal to or greater than 0.4 is determined to be a valid element (e.g., a non-zero element), the matrix data processing apparatus may separately store the valid elements only as shown in [{1.52, 0, 0, 0.89}, {0, 0.41, 0, 1.75}, {0, 0, 1.03, 0}, {0, 0.48, 0, 0}]. In this case, e.g., when an element having a value less than 0.1 is to be detected from the matrix, the pruning on the initially input matrix 200 has to be re-performed, thereby degrading flexibility and expandability in the data processing. Also, according to the related art, four symbols may be required to indicate an index of a valid element, because four rows in the matrix have all different arrangements from one another.

On the other hand, for the case 220 when the relaxed pruning is performed by using two or more threshold values by the matrix data processing method according to an example embodiment, the pruning may be performed on the initially-input matrix 200 in stages, and expandability and flexibility in the data processing may be increased. For example, using to the relaxed pruning of an example embodiment, elements having values less than 0.3 (i.e., the first threshold value) may be determined as invalid elements, and elements having values exceeding 0.5 (i.e., the second threshold value) may be determined as valid elements. In addition, elements having values between 0.3 and 0.5 may be determined as don't-care elements.

Output values of the don't-care elements may be determined such that the number of symbols required to indicate the indices of the valid elements may be minimized. Accordingly, 0.38 may be output as a valid element, and 0.41 may be output as an invalid element. Therefore the data processing apparatus according to the present example embodiment may separately store valid elements such as [{1.52, 0, 0, 0.89}, {0.38, 0, 0, 1.75}, {0, 0, 1.03, 0}, {0, 0, 0.31, 0}]. As the don't-care elements are used, only two symbols may be required to indicate the indices of the valid elements in the matrix. In this case, data [{1, 0, 0, 1}, {1, 0, 0, 1}, {0, 0, 1, 0}, {0, 0, 1, 0}] indicating index values of the valid elements may be separately stored, and the valid elements may be stored as a matrix [1.52, 0.89, 0.38, 1.75, 1.03, 0.31] for reducing an amount of memory use.

A pruning method according to an example embodiment will be described in more detail below with reference to FIG. 4.

According to an example embodiment, when a pruning of an M×N matrix including non-zero elements is called for, the matrix data processing apparatus may obtain a bitstream (|nzVec|) including M·N bits. In this case, the matrix data processing apparatus may scan the obtained bitstream, and may detect a bit pattern of a certain length per each cycle. The length of the bit pattern that is searched for per single cycle may be determined by using a separate parameter (e.g., 'symLen'). For example, the length of the bit pattern in the example of FIG. 4 is eight. In this case, a bit position in eight bits ('symLen'), in which 0 or 1 may be selected, may be determined based on a threshold value from $th_L$ to $th_H$. Thus, the matrix data processing apparatus according to an example embodiment may identify a dense weight matrix for the same position (|nzVec|) at which the current bit pattern (bitPattern) is being extracted. In an example embodiment, the pruning algorithm may run iteratively, until there is no bitPattern that is to be moved, and a new bit pattern 201 may be selected.

Figure 5:
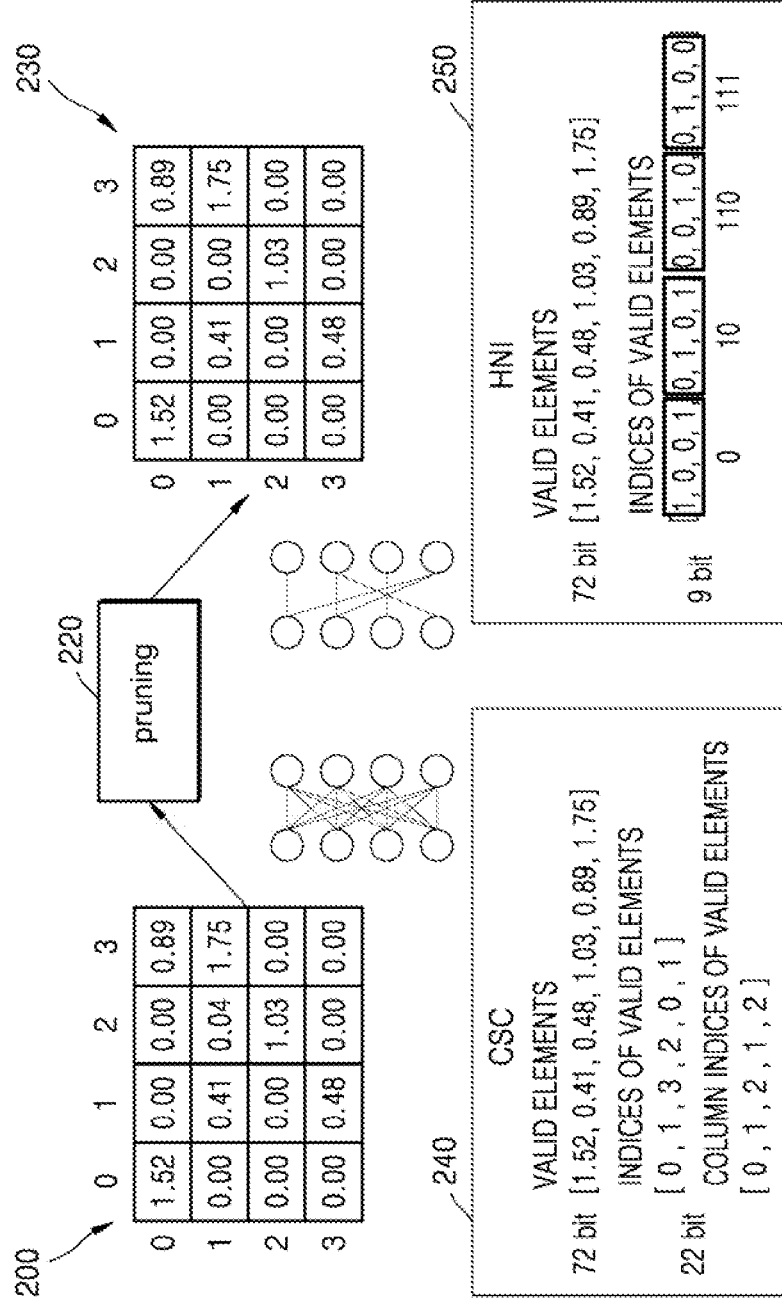
FIG. 5 is a diagram for describing a method of generating a bitstream according to an example embodiment.

FIG. 5 is a diagram for describing a method of generating a bitstream according to an example embodiment.

The matrix data processing apparatus according to the present example embodiment may obtain a result matrix 230 by performing a pruning 220 on an initial matrix 200. Hereinafter, a method of effectively storing the result matrix 230 that is obtained by using the Huffman code according to an example embodiment will be described below with reference to FIG. 5. FIG. 5 illustrates a method (240) of storing matrix data by using a compressed sparse column (CSC) format according to a comparative example, and a method (250) of storing matrix data by using a Huffman-coded Non-zero Indication (HNI) format according to an example embodiment.

The CSC format according to the comparative example may store a matrix only storing valid elements of the result matrix 230, i.e., [1.52, 0.41, 0.48, 1.03, 0.89, 1.75], and a matrix [0, 1, 3, 2, 0, 1][0, . . . ] corresponding to row and column indices of the valid elements.

On the other hand, when the HNI format according to an example embodiment is used, a matrix [1, 0, 0, 1, 0, 1, 0, 1, 0, 0, 1, 0, 0, 1, 0, 0] corresponding to indices of the valid elements and a bitstream "1001010100100100" corresponding to the above matrix may be obtained. After that, the bitstream may be partitioned as a plurality of lower bitstreams ('1001', '0101', '0010', '0100') according to the designated number, and a Huffman code corresponding to each of the plurality of lower bitstreams may be generated. Four lower bitstreams each including four bits may be sequentially expressed as the Huffman code "010110111". Thus, according to the present example embodiment, index information of the valid element in the matrix may be compressed and stored as the Huffman code.

Figure 6:
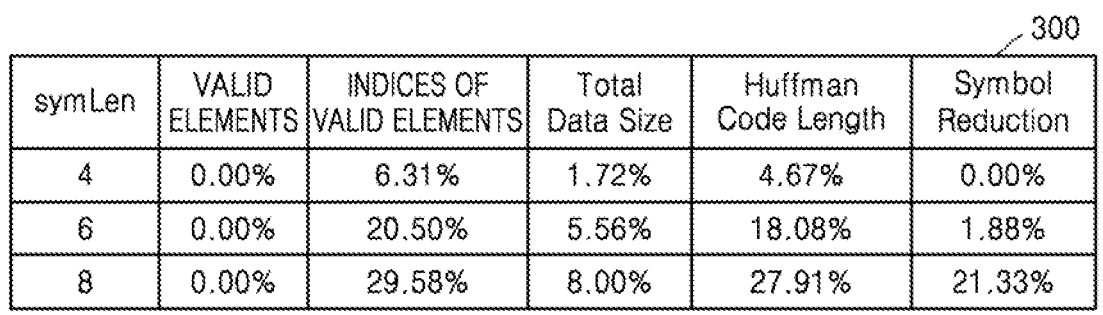
FIG. 6 is a table showing a lower bitstream according to an example embodiment.

FIG. 6 illustrates a table 300 showing a lower bitstream according to an example embodiment.

According to the present example embodiment, when the bitstream includes a plurality of lower bitstreams, a compression efficiency of the matrix data may increase as the number of bits ('symLen') constituting each of the lower bitstreams may be increased. However, in this case, the number of bits constituting each of the lower bitstreams does not exceed an available capacity of the lower bitstream memory for each Huffman code.

FIGS. 7 to 10 are diagrams for describing a matrix data processing apparatus according to an example embodiment.

In an example embodiment, the matrix data processing apparatus may generate a Huffman tree corresponding to the Huffman codes, and may include look-up tables corresponding to each level in the Huffman tree. The number of look-up tables corresponding to an n-th level of the Huffman tree may be greater than that of the look-up tables corresponding to an n+1st level of the Huffman tree.

In more detail, the matrix data processing apparatus according to the present example embodiment may store the Huffman tree consisting of nodes corresponding respectively to the above-described lower bitstreams by using a parallel Huffman decoder and a multi-level look-up table (LUT). The lower the level of the Huffman tree is, the higher the frequency of reference is. Therefore, the matrix data processing apparatus according to the present example embodiment may include an LUT corresponding to level 0 with respect to each multiply and accumulate (MAC) unit.

Here, a reference frequency of level 1 is lower than that of the level 0. Thus, the number of LUTs corresponding to the level 1 is less than that of the LUTs corresponding to the level 0. For example, when the number of MAC units is equal to the number of LUTs corresponding to the level 0, the number of LUTs corresponding to the level 1 may be half the number of LUTs corresponding to the level 0, and the number of LUTs corresponding to level 2 may be half the number of LUTs corresponding to the level 1. A processing element (PE) efficiency of the matrix data processing apparatus may be improved through the above-described hardware architecture.

Figure 7:
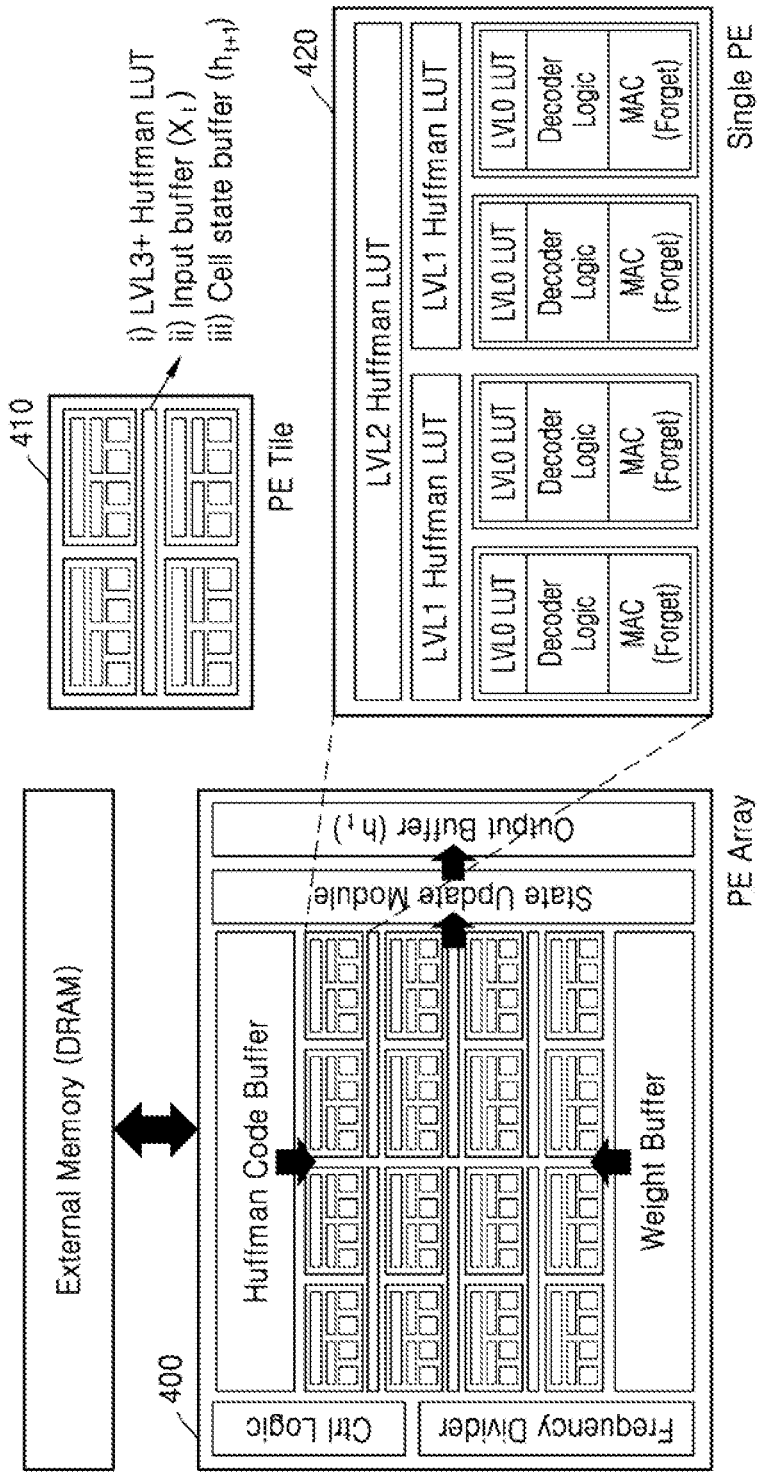
FIGS. 7 to 10 are diagrams for describing a matrix data processing apparatus according to another example embodiment.

FIG. 7 shows an architecture of a matrix data processing apparatus according to an example embodiment, which may include a PE array, a data buffer, a control logic, a Huffman decoder having a shared LUT, and a frequency divider.

The PE array may perform a matrix operation. For example, the PE array of the matrix data processing apparatus performing a matrix operation of an artificial neural network may calculate matrix-vector multiplication for a state update at each neural network layer. A single PE may have, for example, four MAC units at which decoder logics are connected. The decoder logic may access one or more multi-level Huffman LUTs to provide bit-positions where non-zero elements are present at a given symbol length ('symLen'). Each MAC unit may update the state of a gate (e.g., record delete, input, cell, or output gate). The above-described four PEs may set up a single PE tile that shares a memory for higher-level Huffman LUTs, input buffers, and cell state buffers. In this case, the input buffers and the cell state buffers may be distributed across the PE array.

The control logic may distribute data coming from an external memory to proper buffer locations. Thus, the control logic may manage the data flow in the PE array and maximize parallel processes.

The data buffer may include a weight buffer, a Huffman code buffer, an output buffer, an input buffer, and a cell state buffer.

Hereinafter, the Huffman decoder will be described with reference to FIGS. 8 and 9.

Figure 8:
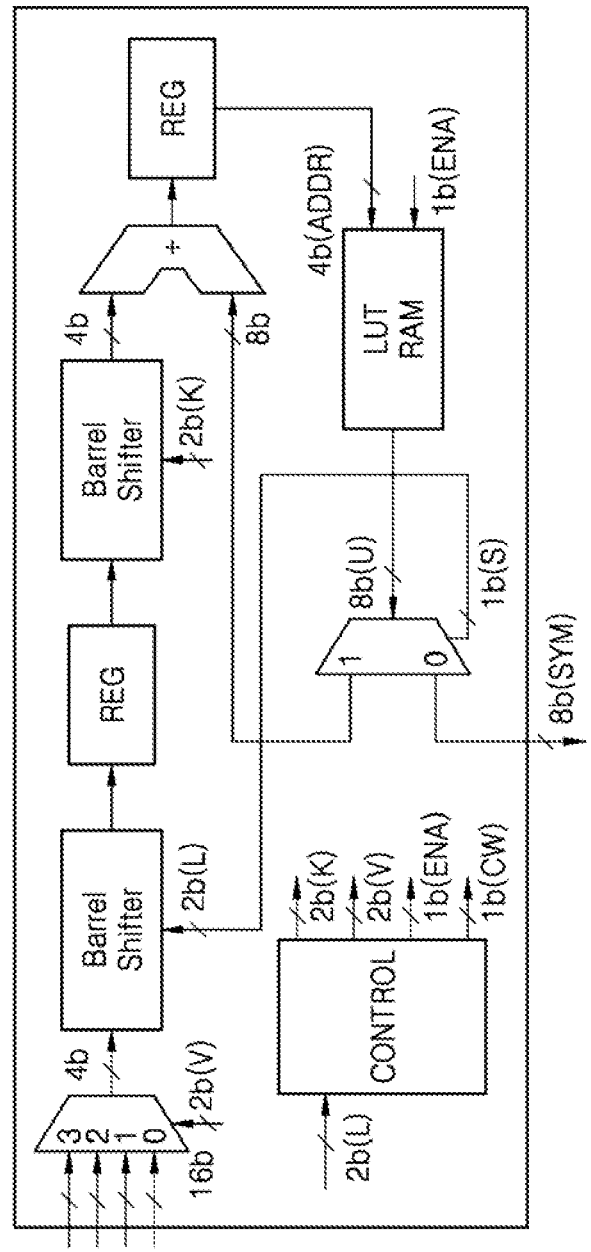
Figure 9:
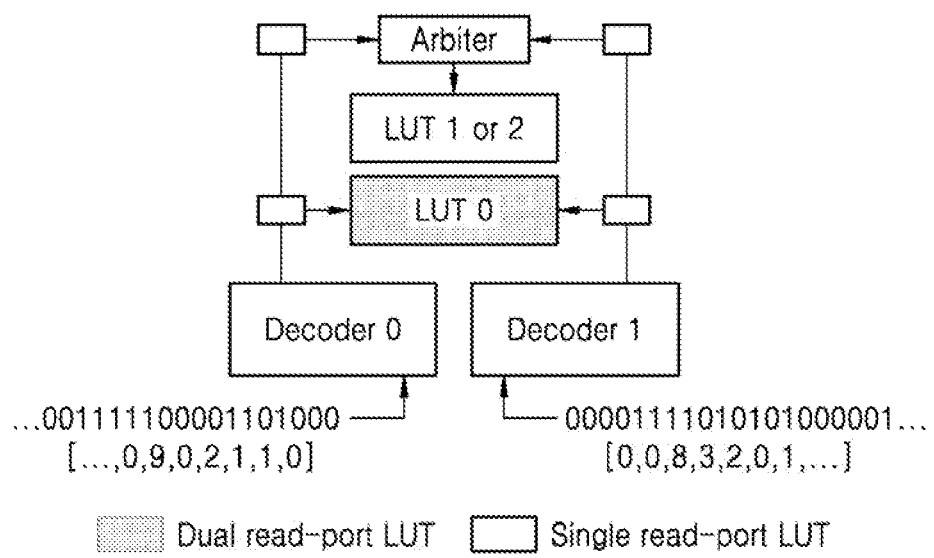

In an example embodiment, a bitstream may be compressed into a Huffman code through a Huffman coding according to the logic shown in FIG. 8. The matrix data processing apparatus according to an example embodiment may minimize an overhead of the data process by using multi-level LUTs respectively corresponding to the levels of the Huffman tree.

In an example embodiment, an on-chip LUT may store the Huffman tree for run-time decoding. The decoder logic, connected to each MAC unit, may access the Huffman LUT in parallel to obtain a symbol for locating valid elements to be computed. In this case, as a length of the Huffman code increases, a probability of accessing an LUT corresponding to a higher level decreases. Therefore, according to an example embodiment, several PEs share the higher level LUT, and the memory overhead that is used for the Huffman decoding may be reduced. FIG. 9 shows an example of a corresponding bitstream.

A frequency divider will be described below with reference to FIG. 10.

Figure 10:
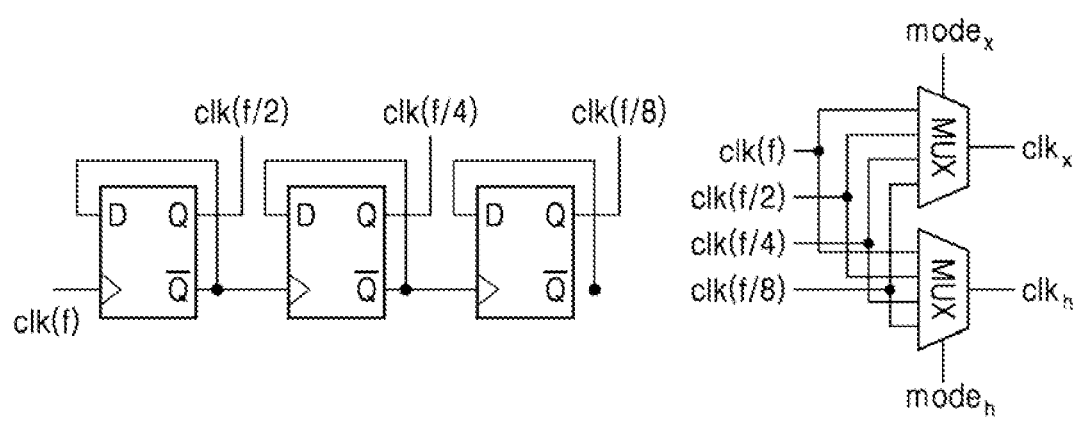

Referring to FIG. 10, the frequency divider may provide multiple clock signals at different frequencies to flexibly handle various sparsity levels. For example, when a decoded symbol is '11011110', a MAC unit may compute 6 multiplications that require 6 clock cycles. In this case, the decoder logic and Huffman LUTs may stop operating for the next five clock cycles to reduce consuming dynamic power. The number of decoded symbols on average may be determined by the sparsity of a given matrix. Therefore, the matrix data processing apparatus according to the present example embodiment may use a slower clock such that one valid element on average may be provided to each MAC unit, instead of deactivating the decoder or the LUT.

Example embodiments may be embodied in the form of a computer program, which may be run in and/or executed by a computer through various elements, and the computer program may be embodied on a non-transitory computer-readable recording medium. Examples of the non-transitory computer-readable recording medium include magnetic media (e.g., hard disks, floppy disks, and magnetic tapes), optical media (e.g., CD-ROMs and DVDs), magneto-optical media (e.g., floptical disks), and hardware devices specifically configured to store and execute program commands (e.g., ROMs, RAMs, and flash memories).

Meanwhile, the computer programs may be specially designed or well known to one of ordinary skill in the computer software field. Examples of the computer programs may include not only machine language code but also high-level language code which is executable by various computing means by using an interpreter.

Herein, artificial intelligence (AI) may denote a field of researching AI or a methodology capable of making AI, and machine learning is a field of AI technology, i.e., a technical method for a computing device to learn through data and to understand certain objects or conditions or to find data patterns and classify the patterns, e.g., an algorithm allowing a computer to analyze data. Machine learning may be understood as including an operating method for learning an AI model.

As described above, embodiments may provide a method and apparatus for effectively compressing a matrix having sparsity and rapidly processing matrix data.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An operating method of a matrix data processing apparatus, comprising:
with respect to each of one or more elements included in a processing element array matrix, when a value of each element satisfies a designated condition, determining the element to be a don't-care element and determining an output value of the don't-care element;
generating a bitstream based on the output value of the don't-care element and index values of valid elements included in the matrix;
equally dividing the bitstream, in accordance with a frequency divider, into pieces of a designated number, and generating a Huffman code, based at least in part on a Huffman decoder in conjunction with a multi-level Huffman look up table (LUT) stored in a memory device, corresponding to each of a plurality of lower bitstreams that are generated as a result of the equal division;
updating a state of a gate based on the generated Huffman code; and
displaying, by a display communicatively coupled to a communication module, a first data in accordance with the updated state of the gate.

2. The matrix data processing method as claimed in claim 1, wherein:
each of the valid elements is a non-zero element, and
the determining of the output value of the don't-care element includes, when the value of the element is greater than a first threshold value and less than a second threshold value, changing the element into the don't-care element and determining the output value of the don't-care element as a value of an invalid element or the don't-care element.

3. The matrix data processing method as claimed in claim 1, wherein:

the bitstream includes bits, the number of which is equal to a number of elements in the matrix, and the generating of the bitstream includes generating a bitstream including 1 bits corresponding to indices of the valid elements and 0 bits corresponding to indices of invalid elements.

4. A matrix data processing apparatus comprising:

a processing element (PE) array;

a data buffer;

a control logic;

a Huffman decoder;

a frequency divider; and a processor, the processor being configured to:

distribute, in accordance with the control logic, a data flow from an external memory into the PE array via the data buffer, the PE array comprising a plurality of elements:

determine each element of the PE array to be a don't-care element when a value of the element satisfies a designated condition;

determine an output value of the don't-care element as an element value of an invalid element or the don't-care element;

generate a bitstream based on the output value of the don't-care element and index values of valid elements included in the matrix;

equally divide, based at least in part on the frequency divider, the bitstream into a designated number of pieces;

generate, based at least in part on the Huffman decoder in conjunction with a multi-level Huffman look up table (LUT) stored in a memory device, a Huffman code corresponding to each of a plurality of lower bitstreams that are obtained as a result of the equal division;

update a state of a gate based on the generated Huffman code; and display, by a display communicatively coupled to a communication module, a first data.

5. The matrix data processing apparatus as claimed in claim 4, wherein:

the processor is further configured to generate a Huffman tree corresponding to the Huffman code, and the multi-level LUT further includes look-up tables respectively corresponding to levels in the Huffman tree, and a number of look-up tables corresponding to an n-th level of the Huffman tree is greater than a number of look-up tables corresponding to an n+1st level of the Huffman tree.

6. The matrix data processing apparatus as claimed in claim 4, wherein:

each of the valid elements is a non-zero element, and the processor is further configured to, when the value of the element is greater than a first threshold value and less than a second threshold value, change the element into the don't-care element.

7. The matrix data processing apparatus as claimed in claim 4, wherein:

the bitstream includes bits, the number of which is equal to a number of elements in the matrix, and the processor is further configured to generate a bitstream including 1 bits corresponding to indices of the valid elements and 0 bits corresponding to indices of the invalid elements.

8. A non-transitory computer-readable recording medium comprising instructions which, when executed, cause a computer to execute the method according to claim 1.

* * * * *